United States Patent [19]
Seki et al.

[11] Patent Number: 5,553,089
[45] Date of Patent: Sep. 3, 1996

[54] SEMICONDUCTOR LASER STACK WITH LENS AND METHOD OF MANUFACTURING THE SAME

[75] Inventors: Akinori Seki; Toyokazu Ohnishi, both of Toyota; Jiro Nakano, Okazaki, all of Japan

[73] Assignee: Toyota Jidosha Kabushiki Kaisha, Toyota, Japan

[21] Appl. No.: 324,706

[22] Filed: Oct. 18, 1994

[30] Foreign Application Priority Data

Oct. 19, 1993 [JP] Japan ..................... 5-261086

[51] Int. Cl.⁶ ........................................ H01S 3/18
[52] U.S. Cl. .................. 372/43; 372/50; 372/101; 372/108; 257/98
[58] Field of Search ................. 372/43, 50, 101, 372/108; 257/98

[56] References Cited

U.S. PATENT DOCUMENTS 5,081,639  1/1992  Snyder et al. .
5,086,431  2/1992  Hardy, Jr. et al. .
5,212,706  5/1993  Jain ............................. 372/50

FOREIGN PATENT DOCUMENTS 17374      10/1980  European Pat. Off. .
63-100790   5/1988  Japan .
292961      7/1990  Japan .
862491      4/1986  WIPO .

OTHER PUBLICATIONS

"Semiconductor Laser Creates its Own Lens", Electronic Components and Applications, vol. 1, No. 2, Feb. 1979, p. 129.

*Primary Examiner*—Rodney B. Bovernick
*Assistant Examiner*—Robert McNutt
*Attorney, Agent, or Firm*—Cushman, Darby & Cushman

[57] ABSTRACT

A semiconductor laser includes a semiconductor laser chip stack having active layers formed substantially in the central portion thereof in the stacking direction and a pair of opposed reflecting surfaces formed at both ends of the active layers. A convex lens of a light transmissible material fixedly attached to a partially light transmissible reflecting surface of the pair of reflecting surfaces and adapted for converging a laser beam emitted from the partially light transmissible reflecting surface.

7 Claims, 6 Drawing Sheets

5,553,089

SEMICONDUCTOR LASER STACK WITH LENS AND METHOD OF MANUFACTURING THE SAME

BACKGROUND OF THE INVENTION

1. Field of the Invention

The present invention relates to a semiconductor laser and a method of manufacturing the same, and more particularly to a semiconductor laser which is easy to manufacture and a method of manufacturing the same.

2. Description of the Prior Art

Conventionally, a technique has been proposed to improve the luminous efficiency of radiation of a semiconductor laser. Such a technique is disclosed, for example, in Japanese Laid-Open Utility Model Publication No. 2-92961.

FIG. 12 shows a sectional structure of such a prior art semiconductor laser. In FIG. 12, a semiconductor laser chip 80 is formed by stacking in sequence an n-GaAs substrate 82, an n-$Al_{0.35}Ga_{0.65}As$ clad layer 83, an undoped GaAs active layer 84, a p-$Al_{0.35}Ga_{0.65}As$ clad layer 85 and a p-GaAs contact layer 86. An n-side electrode 81 is attached to the n-GaAs substrate 82, and a p-side electrode 87 is attached to the p-GaAs contact layer 86. An insulating protector coat 91 is attached to a radiant end surface 92 of the semiconductor laser chip 80. The insulating protector coat 91 has a projecting convex lens 91a formed at a portion opposite the end of the active layer 84. With this construction, a laser beam emitted from the end of the active layer 84 can be converged by the projecting convex lens 91a. Thus, the luminous efficiency of radiation can be substantially improved.

In the above prior art, however, the active layer 84 is not located in the central portion of the semiconductor laser chip 80 in the stacking direction thereof. Instead, it is located in the vicinity of the p-side electrode 87. As seen in FIG. 12, the height of the semiconductor laser chip 80 in the stacking direction includes a height de of 2 to 20 μm and another height ds of 100 to 200 μm. Therefore, it has been impossible for the projecting convex lens 91a formed by resin dropping to have its optical axis positioned at the end of the active layer. Furthermore, design for a converging lens and others in an external optical system has been complicated.

SUMMARY OF THE INVENTION

It is an object of the present invention to provide a semiconductor laser in which a projecting convex lens is easily formed and design for an external optical system is simplified, and also to provide a method of manufacturing the same.

A first aspect of the present invention relates to a semiconductor laser comprising a semiconductor laser chip stack having active layers formed substantially in the central portion thereof in the stacking direction and a pair of opposed reflecting surfaces formed at both ends of the active layers, one of the pair of reflecting surfaces constituting a partially light transmissible reflecting surface. A convex lens of a light transmissible material is attached to the partially light transmissible reflecting surface and adapted for converging a laser beam emitted from the active layers and through the partially light transmissible reflecting surface.

As the semiconductor laser has the active layers serving as radiant sections located substantially in the central portion of the semiconductor laser chip stack in the stacking direction thereof, the convex lens of a light transmissible material for converging the laser beam can be easily fixed to the partially light transmissible reflecting surface formed at the end of the active layers. Further, the design for the external optical system can be simplified.

A second aspect of the present invention relates to a method of manufacturing the above semiconductor laser, comprising the steps of forming a first laser chip by stacking in sequence, on a semiconductor substrate of a first conductive type constituting a first clad layer, a first active layer and a semiconductor layer of a second conductive type constituting a second clad layer, forming a second laser chip by stacking in sequence, on a semiconductor substrate of the second conductive type constituting a third clad layer, a second active layer and a semiconductor layer of the first conductive type constituting a fourth clad layer, joining the surface of the second conductive type semiconductor layer constituting the second clad layer and the surface of the first conductive type semiconductor layer constituting the fourth clad layer to form a semiconductor laser chip stack, and attaching a convex lens of a light transmissible material to a partially light transmissible reflecting surface of a pair of reflecting surfaces formed at both ends of each of the first and second active layers and opposite to each other.

According to this manufacturing method, the second conductive type semiconductor layer constituting the second clad layer of the first laser chip and the first conductive type semiconductor layer constituting the fourth clad layer of the second laser chip are joined, so that the first conductive type semiconductor substrate constituting a large part of the first laser chip in the stacking direction thereof and the second conductive type semiconductor substrate constituting a large part of the second laser chip in the stacking direction thereof are located outside of the first and second active layers, respectively.

Thus, the first and second active layers are located substantially in the central portion of the semiconductor laser chip stack in the stacking direction thereof. This assures easy fixture of the convex lens of a light transmissible material for converging laser beam from the first and second active layers through the partially light transmissible reflecting surface formed at the end of the first and second active layers, and also assures simplified design for the external optical system.

The above and other objects and aspects of the present invention will become more apparent from the following detailed description of the present invention when taken in conjunction with the accompanying drawings.

DETAILED DESCRIPTION OF THE PREFERRED EMBODIMENTS

Now, first and second embodiments of the present invention will be described with reference to the drawings.

Figure 1:
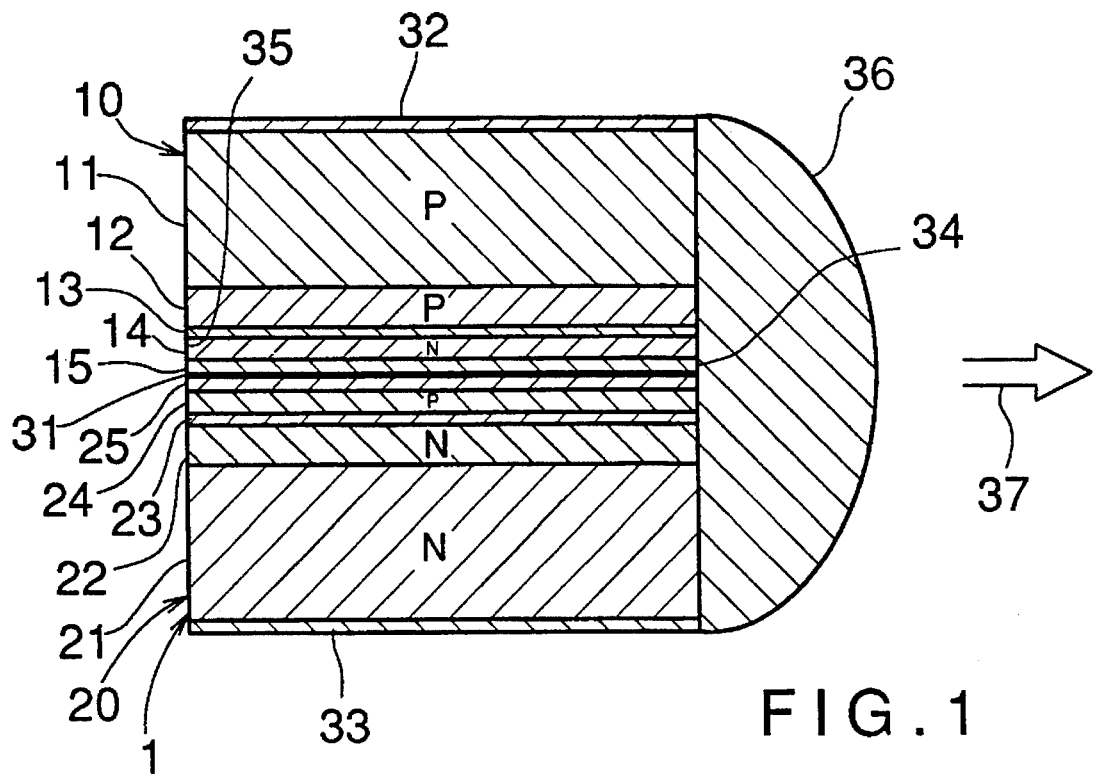
FIG. 1 is a sectional view of a first embodiment of the present invention.

FIG. 1 shows a sectional structure of a semiconductor laser according to the first embodiment. In FIG. 1, a first laser chip 10 is formed by stacking in sequence a first $p^+$-GaAs substrate 11, a first p-$Al_xGa_{1-x}As$ clad layer 12, a first undoped GaAs active layer 13, a second n-$Al_xGa_{1-x}As$ clad layer 14, and a first $n^+$-GaAs contact layer 15.

A second laser chip 20 is formed by stacking in sequence a second $n^+$-GaAs substrate 21, a third n-$Al_xGa_{1-x}As$ clad layer 22, a second undoped GaAs active layer 23, a fourth p-$Al_xGa_{1-x}As$ clad layer 24, and a second $p^+$-GaAs contact layer 25.

A solder layer 31 is used to join the surface of the first $n^+$-GaAs contact layer 15 of the first laser chip 10 and the surface of the second $p^+$-GaAs contact layer 25 of the second laser chip 20 to form a semiconductor laser chip stack 1. A p-side electrode 32 is fixedly attached to the surface of the first $p^+$-GaAs substrate 11, and an n-side electrode 33 is fixedly attached to the surface of the second $n^+$-GaAs substrate 21.

A pair of first and second reflecting surfaces 34 and 35 opposite to each other are formed at both ends of each of the first undoped GaAs active layer 13 and the second undoped GaAs active layer 23. The first reflecting surface 34 is partially light transmissible, while the second reflecting surface 35 is formed of a highly reflective thin film having a substantially high reflectance in comparison with the first reflecting surface 34.

A convex lens 36 made of a transparent epoxy resin which is a light transmissible material is attached to the first reflecting surface 34. The convex lens 36 may be formed by dropping a transparent epoxy resin on the first reflecting surface 34, immersing the first reflecting surface 34 in a transparent epoxy resin, or using a mold. The height of the convex lens 36 is substantially equal to the height of the laser chip stack 1, and the optical axis of the convex lens 36 is positioned around the ends of the active layers 13 and 23. An arrow 37 shows the direction of emission of the laser beam.

The semiconductor laser chip stack 1 with the convex lens 36 of the above construction is obtainable by cutting a large preformed stack bar into a plurality of individual semiconductor laser stacks. In this case, the cutting plane is parallel to the plane in FIG. 1. Therefore, the convex lens 36 is not semi-spherical but semi-cylindrical in configuration.

With this construction, the second clad layer 14 of the first laser chip 10 and the fourth clad layer 24 of the second laser chip 20 are joined through the first contact layer 15, the solder layer 31 and the second contact layer 25, so that the first substrate 11 constituting a large part of the first laser chip 10 in the stacking direction thereof and the second substrate 21 constituting a large part of the second laser chip 20 in the stacking direction thereof are located outside of the first active layer 13 and the second active layer 23, respectively. Thus, the first active layer 13 and the second active layer 23 are located substantially in the central portion of the semiconductor laser chip stack 1 in the stacking direction thereof. This permits easy formation of the convex lens 36 of a light transmissible material for converging the laser beams from the first active layer 13 and the second active layer 23.

Furthermore, as the first active layer 13 and the second active layer 23, which emit laser beams, are disposed adjacent to and symmetrically with respect to the optical axis of the convex lens 36, the laser beam produced has a radiating pattern that is symmetrical with respect to the optical axis of the convex lens 36. Thus, in case any additional lens are required, the design of the external optical system becomes simplified.

In the above embodiment, the shape of the convex lens 36 is not limited to the semi-cylindrical configuration but it may be others such as a semi-spherical configuration.

FIGS. 2 to 11 show the manufacturing process of the semiconductor laser according to a second embodiment of the invention.

Figure 2:
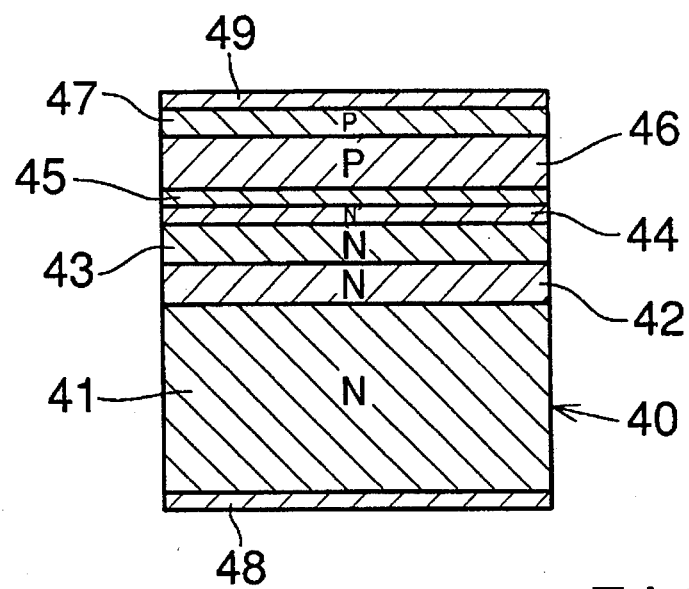
FIG. 2 is a sectional view illustrating a part of a manufacturing process of a second embodiment of the present invention.

In FIG. 2, a semiconductor laser chip 40 is formed by stacking in sequence through epitaxial growth an n-GaAs substrate 41, an n-GaAs buffer layer 42, an n-$Al_{0.4}Ga_{0.6}As$ clad layer 43, an n-$Al_{0.3}Ga_{0.7}As$ clad layer 44, a GaAs active layer 45, a p-$Al_{0.5}Ga_{0.5}As$ clad layer 46 and a $p^+$-GaAs contact layer 47.

Further, an n-side electrode 48 constituted by AuGe/Ni/Au layer is attached to the lower surface of the n-GaAs substrate 41, as seen in the drawing, and a p-side electrode 49 constituted by Cr/Pt/Au layer is attached to the upper surface of the $p^+$-GaAs contact layer 47, as seen in the drawing.

Figure 3:
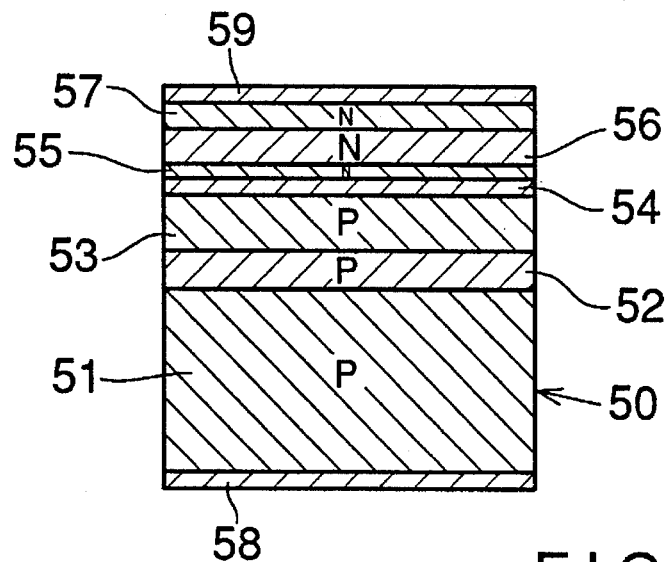
FIG. 3 is a sectional view illustrating another part of the manufacturing process of the second embodiment.

In FIG. 3, a semiconductor laser chip 50 is formed by stacking in sequence through epitaxial growth a p-GaAs substrate 51, a $p^+$-GaAs buffer layer 52, a p-$Al_{0.5}Ga_{0.5}As$ clad layer 53, a GaAs active layer 54, an n-$Al_{0.3}Ga_{0.7}As$ clad layer 55, an n-$Al_{0.4}Ga_{0.6}As$ clad layer 56 and an n-GaAs contact layer 57.

Further, a p-side electrode 58 constituted by Cr/Pt/Au layer is attached to the lower surface of the p-GaAs substrate 51, as seen in the drawing, and an n-side electrode 59 constituted by AuGe/Ni/Au layer is attached to the upper surface of the n-GaAs contact layer 57, as seen in the drawing.

Figure 4:
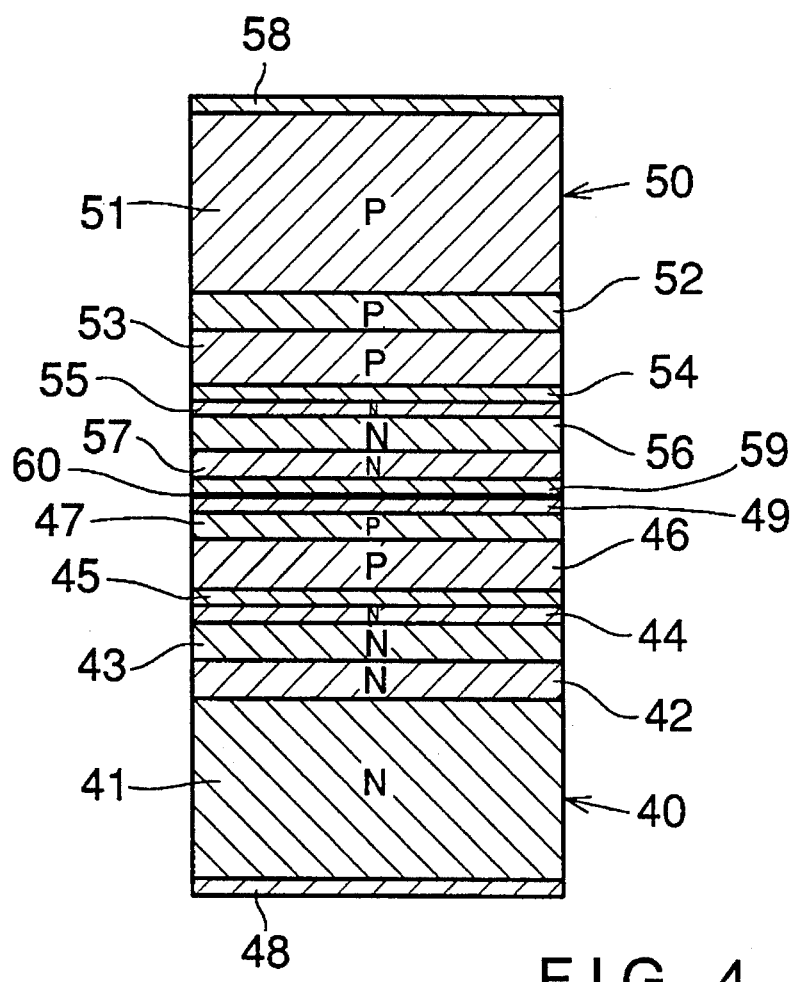
FIG. 4 is a sectional view illustrating the manufacturing process subsequent to FIGS. 2 and 3.

In FIG. 4, the p-side electrode 49 of the semiconductor laser chip 40 and the n-side electrode 59 of the semiconductor laser chip 50 are joined by a solder layer 60.

Figure 5:
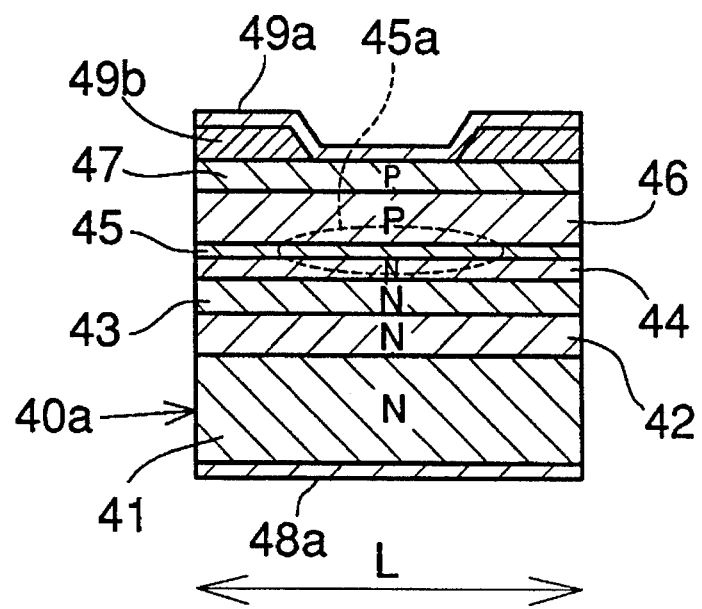
FIG. 5 is a sectional view of a practical example of the semiconductor laser chip of the second embodiment.

FIG. 5 shows a practical structure of the semiconductor laser chip 40. The n-GaAs substrate 41 is 100 μm in thickness, the n-$Al_{0.4}Ga_{0.6}As$ clad layer 43 1.5 μm, the n-$Al_{0.3}Ga_{0.7}As$ clad layer 44 0.5 μm, the GaAs active layer 45 0.05 μm, the p-$Al_{0.5}Ga_{0.5}As$ clad layer 46 1.5 μm, and the $p^+$-GaAs contact layer 47 1 μm.

An n-side electrode 48a constituted by AuGe/Ni/Au layer is attached to the lower surface of the n-GaAs substrate 41, as seen in the drawing, and a p-side electrode 49a constituted by Cr/Pt/Au layer is fixedly attached to the upper surface of the $p^+$-GaAs contact layer 47, as seen in the drawing. A current blocking SiN insulator layer 49b having a thickness of 0.5 μm is formed. The semiconductor laser 40a has a length L of 400 to 600 μm in the transverse direction as seen in the drawing.

Owing to the current blocking SiN insulator layer 49b, the practical radiant area is limited within a portion of the GaAs active layer 45 enclosed by a dotted line 45a. In this case, the resonator length is set in the stacking direction to the plane in FIG. 5 and the laser beam is emitted in the direction.

Figure 6:
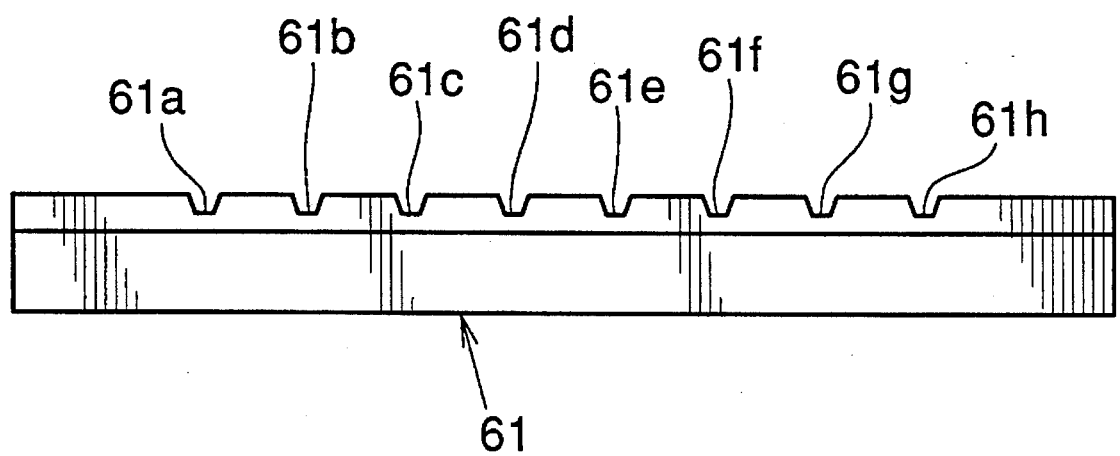
FIG. 6 is a front view illustrating a part of the manufacturing process of the second embodiment.

FIG. 6 is a front view of a laser bar 61 for producing a plurality of (eight in FIG. 6) semiconductor laser chips. The laser bar 61 provides semiconductor laser chips formed by epitaxial growth on an n-type substrate and provided with depressed electrode portions 61a to 61h between adjacent raised portions defined by a current blocking insulator layer.

Figure 7:
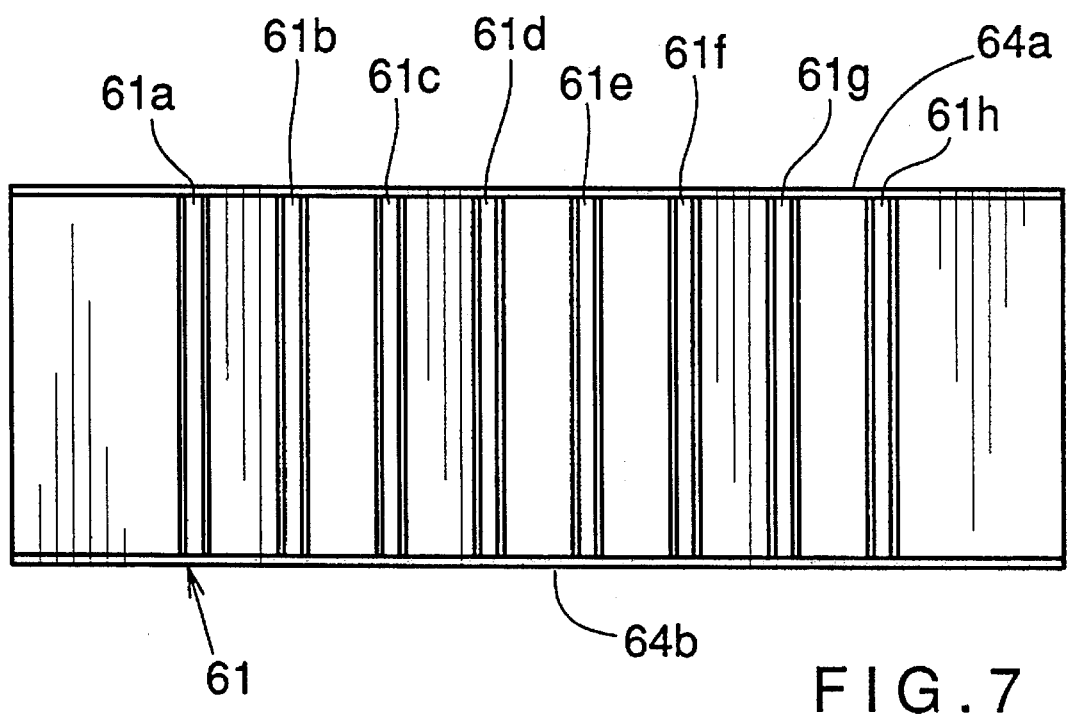
FIG. 7 is a plan view illustrating a part of the manufacturing process subsequent to FIG. 6.

FIG. 7 is a plan view of the laser bar 61. Both side surfaces of the laser bar 61 are covered with end surface coats 64a and 64b.

Figure 8:
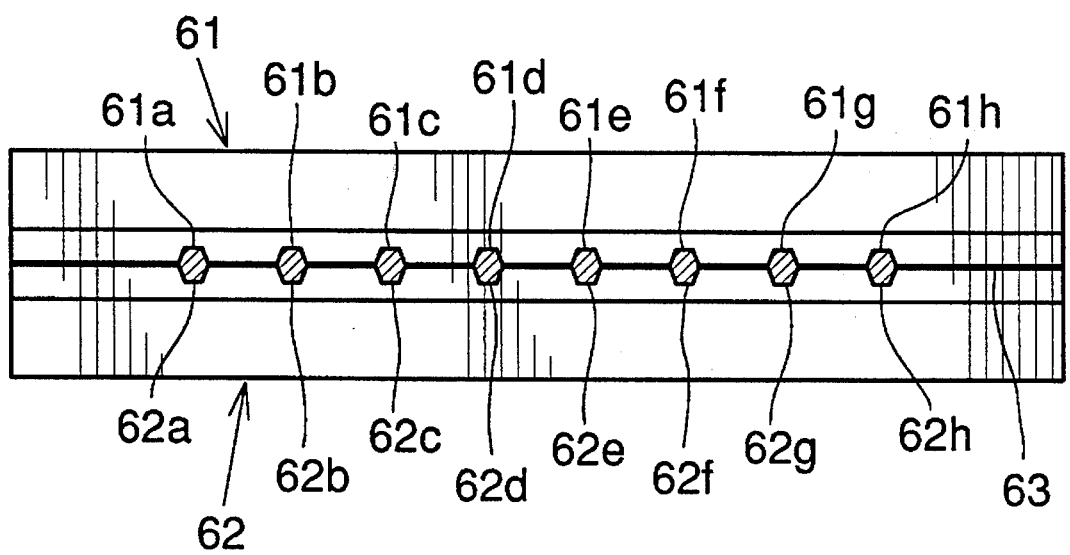
FIG. 8 is a front view illustrating a part of the manufacturing process subsequent to FIG. 7.

FIG. 8 shows the laser bars 61 and 62 joined by a solder layer 63. The laser bar 62 has electrodes 62a to 62h which correspond to the electrodes 61a to 61h of the laser bar 61, respectively. The laser bar 62 provides semiconductor laser chips formed on a p-type substrate. Gaps defined between the electrodes 61a to 61h and the other electrodes 62a to 62h are filled with solder.

Figure 9:
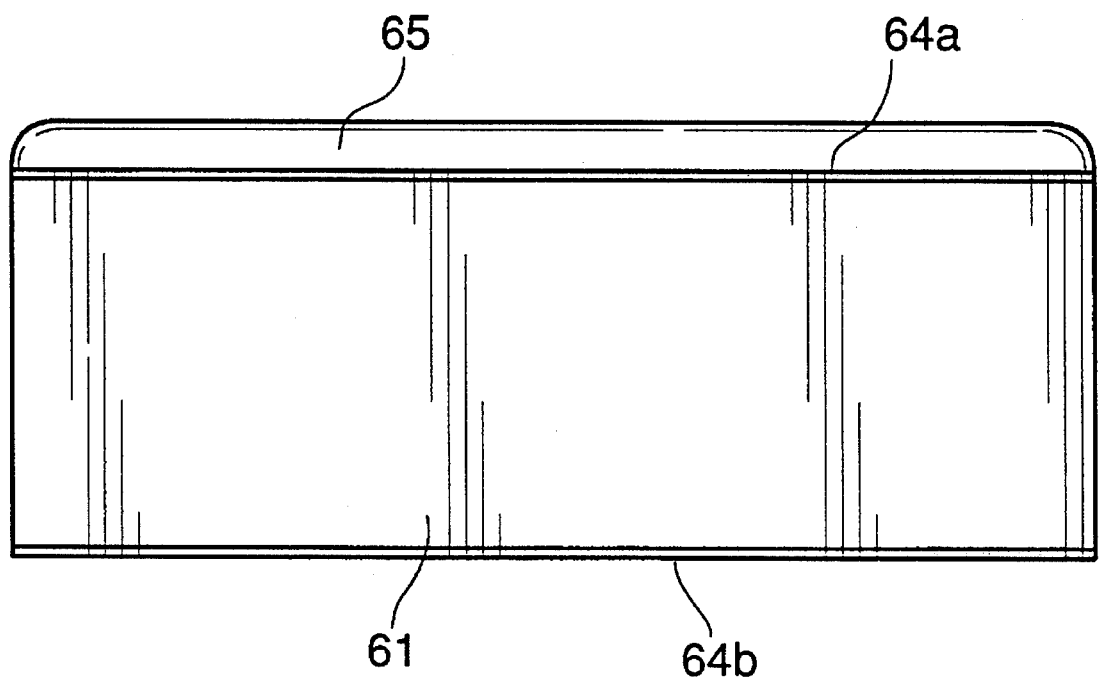
FIG. 9 is a plan view illustrating a part of the manufacturing process subsequent to FIG. 8.
Figure 10:
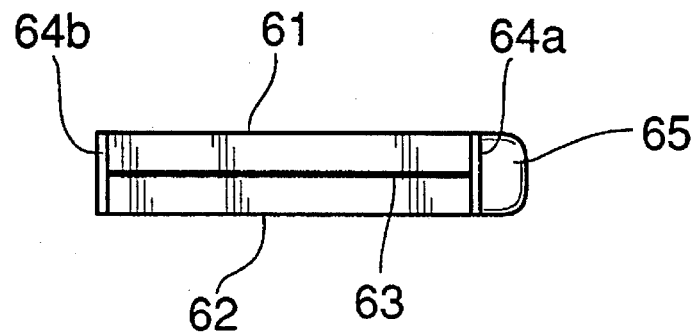
FIG. 10 is a side view of FIG. 9.

FIG. 9 is a plan view of the laser bar combination in FIG. 8. In FIG. 9, a convex lens 65 is fixedly attached to the outside of the end surface coat 64a. FIG. 10 is a side view of the laser bar combination in FIG. 9.

Figure 11:
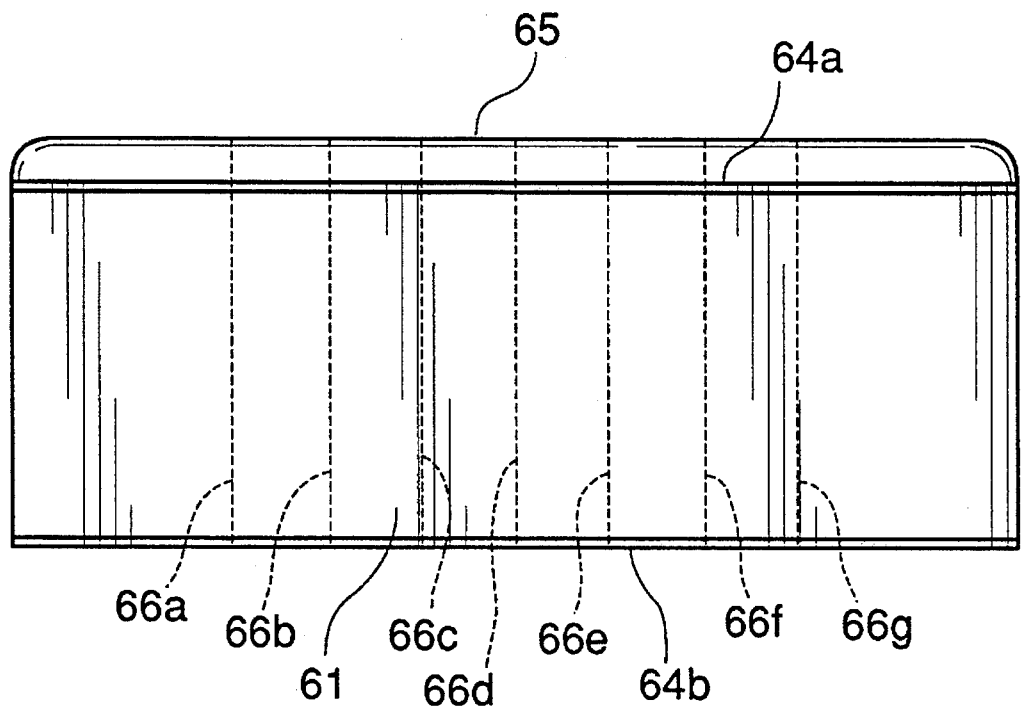
FIG. 11 is a plan view illustrating a part of the manufacturing process subsequent to FIG. 9.
Figure 12:
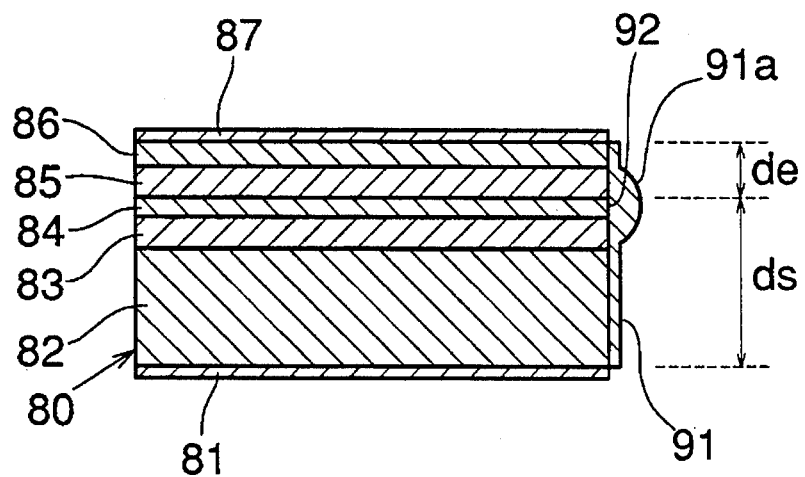
FIG. 12 is a sectional view of a prior art semiconductor laser.

FIG. 11 shows cutting planes 66a to 66g for obtaining individual semiconductor laser chip stacks. This method is effective to produce a semiconductor laser like the one shown in FIG. 1.

As described above, the semiconductor laser of the present invention is effective to facilitate formation of a convex lens fixedly attached to the semiconductor laser chip stack and design for an external optical system. Thus, the cost of the optical system including the semiconductor laser can be reduced.

While the invention has been described with reference to preferred embodiments thereof, it is to be understood that modifications or variations may be easily made without departing from the scope of the present invention which is defined by the appended claims.

What is claimed is:

1. A method of manufacturing a semiconductor laser comprising the steps of:

forming a first laser chip by stacking in sequence on a first semiconductor substrate of a first conductive type defining a first clad layer: a first active layer and a second semiconductor layer of a second conductive type defining a second clad layer;

forming a second laser chip by stacking in sequence on a second semiconductor substrate of said second conductive type defining a third clad layer: a second active layer and a fourth semiconductor layer of said first conductive type defining a fourth clad layer;

joining said first laser chip and said second laser chip such that said first and said second laser chips so joined define a semiconductor laser element, said first and said second laser chips being arranged and connected such that said first active layer and said second active layer are sandwiched between said first semiconductor substrate and said second semiconductor substrate and are located substantially in a central portion of said semiconductor laser element in a stacking direction thereof;

forming a partially light transmissible reflecting surface at a first end of said first and said second active layers of said laser element; and attaching a convex lens of a light transmissible material to said partially light transmissible reelecting surface, wherein a height of said convex lens is substantially equal to a height of said semiconductor laser element.

2. The method as defined in claim 1, wherein said second clad layer and said fourth clad layer are joined through a solder layer.

3. The method as defined in claim 1, wherein said convex lens is attached by dropping a transparent resin on one of said reflecting surfaces.

4. The method as defined in claim 1, wherein said convex lens is attached by immersing one of said reflecting surfaces in a transparent resin.

5. A semiconductor laser comprising:

a first laser chip including a first semiconductor substrate of a first conductive type defining a first clad layer, a first active layer disposed on said first clad layer and a semiconductor layer of a second conductive type defining a second clad layer disposed on said first active layer;

a second laser chip including a second semiconductor substrate of said second conductive type defining a third clad layer, a second active layer disposed on said third clad layer and a semiconductor layer of said first conductive type defining a fourth clad layer disposed on said second active layer;

a joining layer connecting said first and said second laser chips so that said first and said second laser chips so joined define a semiconductor laser element, said first and said second laser chips being arranged and connected such that said first active layer and said second active layer are sandwiched between said first semiconductor substrate and said second semiconductor substrate and are located substantially in a central portion of said semiconductor laser element in a stacking direction thereof;

a partially light transmissible reflecting surface disposed at a first end of said first and said second active layer; and a convex lens of a light transmissible material attached on said partially light transmissible reflecting surface and adapted for converging laser beams emitted from said first and said second active layers, wherein a height of said convex lens is substantially equal to a height of said semiconductor laser element.

6. The semiconductor laser as defined in claim 5, wherein the optical axis of said convex lens is positioned around the ends of the active layers.

7. A semiconductor laser manufactured by the following steps:

forming a first laser chip by stacking in sequence on a first semiconductor substrate of a first conductive type defining a first clad layer: a first active layer and a semiconductor layer of a second conductive type defining a second clad layer;

forming a second laser chip by stacking in sequence on a second semiconductor substrate of said second conductive type defining a third clad layer: a second active layer and a semiconductor layer of said first conductive type defining a fourth clad layer;

joining said first and said second laser chips such that said first and said second laser chips so joined define a semiconductor laser element, said first and said second laser chips being arranged and connected such that said first active layer and said second active layer are sandwiched between said first semiconductor substrate and said second semiconductor substrate and are located substantially in a central portion of said semiconductor laser element in a stacking direction thereof;

forming a partially light transmissible reflecting surface at a first end of said first and said second active layers; and attaching a convex lens of a light transmissible material to said light reflecting surface, wherein a height of said convex lens is substantially equal to a height of said semiconductor laser element.

* * * * *